Figure 1:
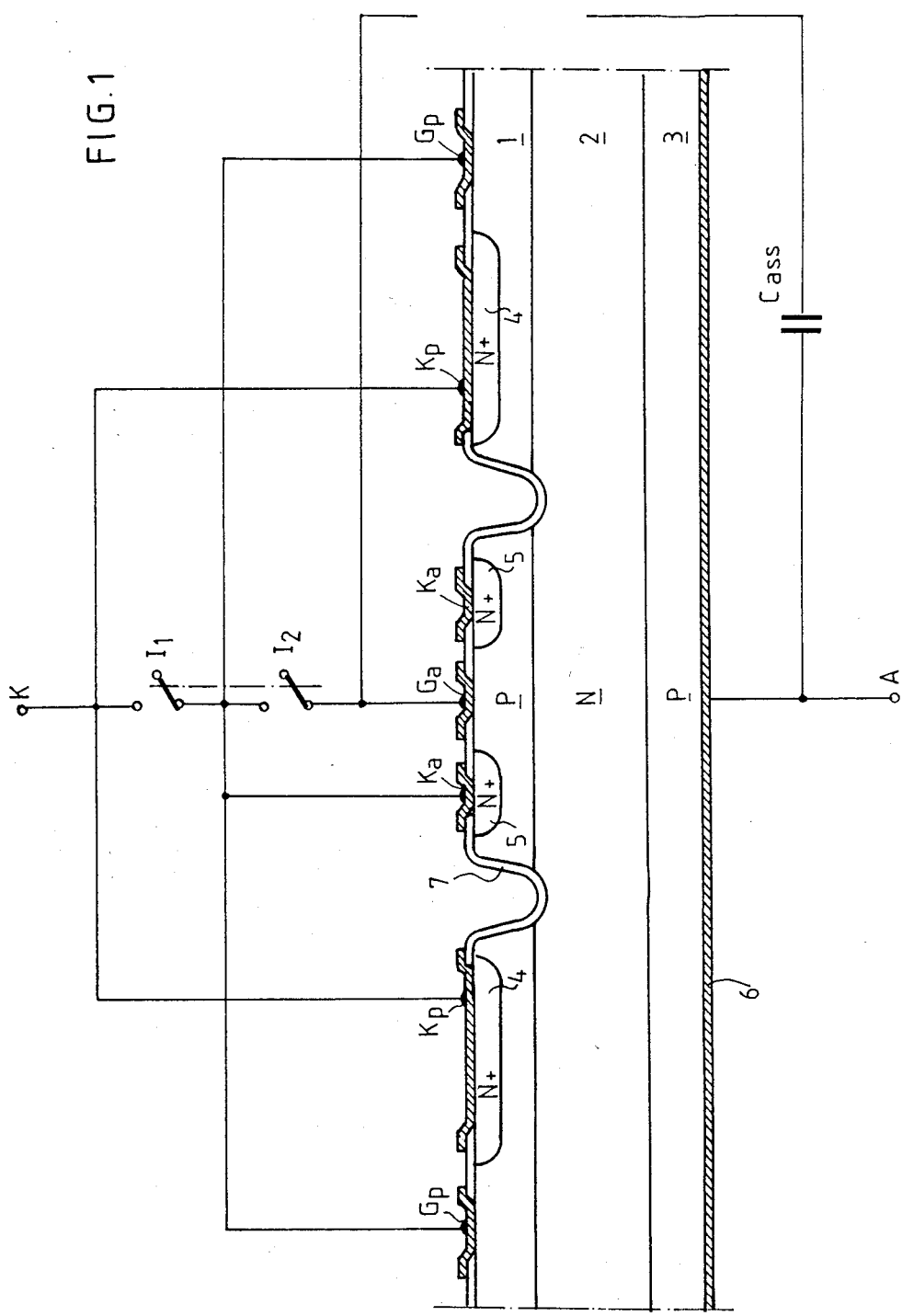

United States Patent [19]

Thire et al.

[11] Patent Number: 4,599,633
[45] Date of Patent: Jul. 8, 1986

[54] INTEGRATED SELF-FIRING AMPLIFIED THYRISTOR STRUCTURE FOR ON/OFF SWITCHING OF HIGH CURRENTS AND CONTROL CIRCUIT THEREOF

[75] Inventors: Jacques Thire, Caen; Georges Souques, Paris, both of France

[73] Assignee: La Telemecanique Electrique, France

[21] Appl. No.: 675,924

[22] PCT Filed: Mar. 1, 1984

[86] PCT No.: PCT/FR84/00047
§ 371 Date: Oct. 18, 1984
§ 102(e) Date: Oct. 18, 1984

[87] PCT Pub. No.: WO84/03588
PCT Pub. Date: Sep. 13, 1984

[30] Foreign Application Priority Data
Mar. 1, 1983 [FR] France .................. 83 03306

[51] Int. Cl.$^4$ .................................. H01L 29/74
[52] U.S. Cl. .......................... 357/38; 357/55; 357/59; 307/252 A; 307/252 J; 307/252 N; 307/305
[58] Field of Search ............ 307/252 A, 252 J, 252 N, 307/305; 357/38, 55, 59, 38 G, 38 A

[56] References Cited

U.S. PATENT DOCUMENTS

| | | | |
|---|---|---|---|
| 3,524,114 | 8/1970 | Hutson | 357/38 |
| 3,891,866 | 6/1975 | Okuhara et al. | 307/252 A |
| 4,135,291 | 1/1979 | Tursky et al. | 357/38 |
| 4,148,053 | 4/1979 | Bossecaar et al. | 357/38 |
| 4,156,250 | 5/1979 | Trap | 357/38 |
| 4,208,669 | 6/1980 | Silber et al. | 357/38 |
| 4,255,675 | 3/1981 | Lehmann et al. | 307/252 A |
| 4,278,705 | 7/1981 | Agraz-Guerena | 357/55 |
| 4,298,881 | 11/1981 | Sakurada et al. | 357/38 |
| 4,315,274 | 2/1982 | Fukoi et al. | 357/38 |
| 4,502,071 | 2/1985 | Herberg | 357/38 |

*Primary Examiner*—Joseph E. Clawson, Jr.
*Attorney, Agent, or Firm*—William A. Drucker

[57] ABSTRACT

An integrated self-firing thyristor structure which comprises a main thyristor having a first emitter portion, a main base, a first inhibition base provided with a bore, a second emitter portion, an auxiliary thyristor using said first emitter portion and said main base and having a second inhibition base which extends in said bore and is insulated therefrom, and a third emitter portion, a conductive element connecting said first inhibition base to said third emitter portion and switching means connected between said conductive element, said second emitter portion and said second inhibition base so that the self-switching-on function of the integrated thyristor can be inhibited by said switching means.

7 Claims, 3 Drawing Figures

INTEGRATED SELF-FIRING AMPLIFIED THYRISTOR STRUCTURE FOR ON/OFF SWITCHING OF HIGH CURRENTS AND CONTROL CIRCUIT THEREOF

The invention relates to structures of the self-firing "thyristor" kind.

In the patent application filed on Nov. 25, 1982 under the No. 82 19728 for "Intrinsic firing thyristor structure and application thereof to the construction of a bidirectional device", intrinsic self-firing thyristor structures were described, that is to say which are triggered off at zero voltage under the effect of the internal displacement current CdV/dt alone, this self-firing being inhibited by a gate-cathode short-circuit and the advantages thereof were mentioned.

These intrinsic self-firing structures comprise successive semiconductor layers forming a first emitter region (preferably of N type), a first base region, or inhibition base (preferably of P type), a second base region (main base, preferably of N type) and a second emitter region (preferably of P type), the first emitter region having at least one cathode contact, the first base region being connected to at least one inhibition gate contact, the second emitter region having an anode contact, and at least one switch means adapted for creating a short-circuit between the inhibition gate and the cathode and thus to inhibit the self-firing faculty of the thyristor and are characterized in that said base and emitter regions are formed so as to constitute a very high sensitivity thyristor.

To this end, the thicknesses and doping of the first emitter and base regions are chosen so that the intrinsic gain of the first NPN transistor is high at low level and passivation of the junctions is particularly taken care of, in accordance with the information given in patent No. 82 19728.

Since it has proved very difficult to produce "intrinsic" self-firing structures on an industrial scale, self-firing was then initialized by means of a small admittance (an assisting resistance of a few megohms, or a capacitor of the order of 10 nF or so).

When these self-firing structures are assisted by a capacitor, the firing time is greatly reduced with respect to assistance by resistor, so that the control thereof by an MOS transistor, which has been contemplated and has proved very practical in application to static relays, becomes difficult because of the time constant for charging the gate of the MOS. On the other hand, when said structures are assisted by resistance, the assistance current does not exceed a few microamps and it is very localized, which limits the possibilities of switching high currents.

If the gate area is increased, the density of the assisting current becomes low and the assistance inefficient.

The present invention proposes overcoming this problem by means of an amplifying gate structure comprising an assisted thyristor, of small size and of very high sensitivity which then becomes the pilot for a main transistor itself having a very high sensitivity.

In this amplifying gate structure, the high sensitivity is however not sufficient for obtaining "intrinsic" selfiring, i.e. without an assisting admittance.

The main aim of the invention is to provide such an amplifying gate structure of integrated type, which has particular advantages. It will be noted that such a structure, despite its similarities with known amplifying gate thyristor structures, is radically distinguished therefrom by its operation, due to its characteristics and its method of control.

According to a first characteristic of the invention, the main thyristor of said amplifying gate structure is of the "mesa" type, whereas the pilot thyristor is formed by a small-sized central portion of the "mesa" structure, and is defined by the "planar" technique, with absence of edge effect, the main base of the pilot thyristor being isolated from that of the main thyristor, contrary to the known structure of an amplifying gate thyristor, the amplifying gate structure of the invention being further characterized, with respect to said known structure, in that control thereof is provided by a gate-cathode short-circuit of the pilot and main thyristors, in that the main thyristor has its own gate and a high sensitivity and in that the resistance between the inhibition base of the pilot thyristor and that of the main thyristor is very high (more than a megohm).

This latter characteristic, advantageously obtained by forming an insulating groove cutting the whole thickness of the base diffusion P, which groove is itself passivated by thermal oxidization using the so-called "planar-groove" technique which allows low surface recombination rates to be maintained and, consequently, a high sensitivity of the pilot thyristor to be maintained, avoids a short-circuit through the emitter junction of the pilot thyristor which would hinder its self-firing.

According to another feature of the invention, the pilot and main thyristors are adapted so that the apparent shunt resistance with respect to the corresponding emitter-base junction is very small, for example for a crystal of 1 cm$^2$, a resistance of a few hundredth to a few tenths of ohms at most, because of the low layer resistance of the P layer, e.g. of the order of 10 $\Omega/\square$) and high interdigitation with narrow emitter bands.

This feature, advantageously obtained by adapting the emitter and/or gate region of the main thyristor so as to obtain a high perimeter to surface ratio, provides an efficient flow of the displacement current under disabled conditions and, consequently, provides excellent disabled behaviour, even in the case of high dV/dt parasites.

According to another feature of the invention, an impedance assisting self-firing, preferably a resistance of a few megohms, or else a capacitor of the order of 10 nF connects the common anode of the two thyristors to the gate contact of the pilot thyristor and firing is obtained by overcoming a short-circuit normally established between the gate and the cathode of the pilot thyristor.

Such a structure, in which the area for injecting the assistance current into the pilot thyristor (area of its emitter) is reduced, has the advantage that the pilot thyristor, which has a considerable gain even at a very low level, is triggered off for the very small control current supplied by the assistance resistance whereas, because of the large area of the main thyristor, the structure may conduct a high current and consequently control a high power.

As was mentioned above, this structure is radically distinguished from the conventional amplifying gate thyristor structure, in which, in particular, triggering of the pilot thyristor is achieved by applying a control voltage to its gate. It has, with respect to this latter, considerable advantages and in particular: a higher resistance of the component because firing is homogeneous over a large part of its surface; simplification of the control circuit, which must simply pass a small current in a short-circuit; better voltage and dV/dt behavior.

In power applications, in industrial networks of 220 V, the structure will have to withstand reverse voltages of about 750 V. It will be noted that the gate-cathode short-circuit transforms the $BV_{CEO}$ voltage behavior into $BV_{CES}$ voltage behavior, which makes it easier to obtain the desired result.

In practice, the thyristor structure comprising the above-mentioned features will however be unsuited for operation in a 380 Veff network. Going over from a supply voltage of 220 Veff to 380 Veff would in fact lead, in particular, to multiplying the lifespan of the minority carriers in the N base by a factor of 3.6, which would necessarily lead to a lifespan of more than 90 microseconds instead of 26 microseconds; such a characteristic is at present unobtainable.

According to another feature of the invention, for increasing the low level gain of the NPN transistor which forms part of the pilot thyristor structure and for thus compensating the loss of gain of the PNP transistor resulting from the increase in thickness of its N base which is required if it is desired to withstand reverse voltages of 1200 V for example, its emitter is constructed in the form of a double $N^+N^-$ layer structure.

It has already been proposed to form double layer emitters in bipolar transistors (see, in particular, the article entitled: "New bipolar device with low emitter impurity concentration structure": IEDM Technical Digest 1971, pages 262–265). These so-called "LEC" structures are intended for high frequency or low power use and no suggestion has been made up to present for applying such a process to the construction of thyristors and, all the more so, amplifying gate structures.

Other features, as well as the advantages of the invention, will be clear from the following description.

Figure 2:
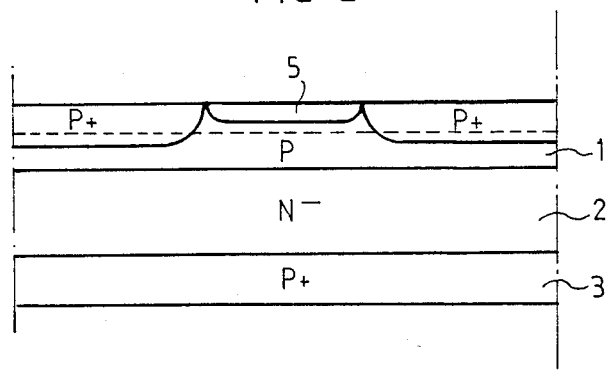
Figure 3:
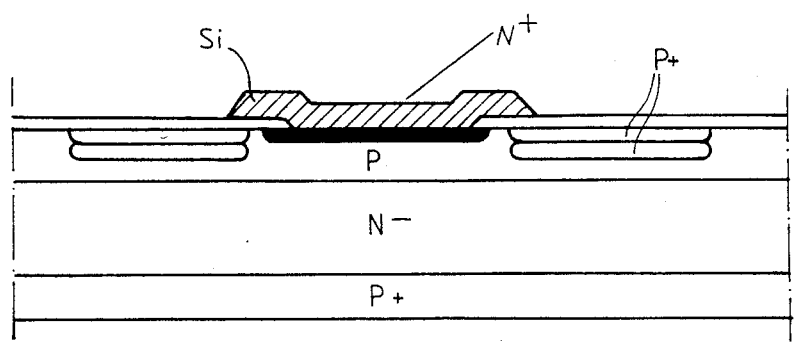

In the accompanying drawings:

FIG. 1 is a simplified diagram of an integrated assisted self-firing thyristor structure in accordance with the invention; and FIG. 2 illustrates a first embodiment of this structure; of which FIG. 3 illustrates a variant.

In FIG. 1 is shown a thyristor structure comprising a P type inhibition base 1, an N type main base 2 and a second P type emitter region 3, which are common to the two thyristors forming the structure.

By using the "planar" technique, first $N^+$ type emitter regions have been formed designated by 4 for the main thyristor, by 5 for the pilot or auxiliary thyristor. Region 5 is situated in the center of the silicon wafer and has a diameter of 1 mm for example, for a wafer of 1 cm for example. These values are not limitative and the real values will depend on the desired power. There is shown at 6 an anode contact, at Kp cathode contacts of the main thyristor, connected to the cathode terminal K of the assembly, at Gp gate contacts of the main thyristor, at Ga gate contacts of the auxiliary thyristor, connected to the anode terminal A of the assembly through an assistance resistance of a few megohms or, in the example shown, by a capacitor Cass of the order of 10 nF, at Ka the cathode contact of the auxiliary thyristor, connected to the contacts Gp and to the terminal K through a switch $I_1$. The common point between Cass and Ga is connected to terminal K through a switch $I_2$ and a switch $I_1$ in series.

By way of example, in a first embodiment in which the $N^+$ emitter has a single layer, the impurity atom concentrations per cm$^3$ are:

$10^{19}$ to $10^{20}$ A/cm$^3$ for regions 4 and 5,
$10^{17}$ A/cm$^3$ for region 1,
$10^{14}$ A/cm$^3$ for region 2,
$10^{17}$ A/cm$^3$ for region 3.

A groove 7 cutting through the whole of the thickness of layer 1 and completely surrounding emitter 5 is formed by the so-called "planar-groove" technique, known per se, which consists in deep etching of the whole layer 1, followed by complementary etching of the whole surface so as to eliminate the sharp angle created by the deep etching and, finally, by thermal oxidization for "planar" passivation. The complementary etching will be imperatively carried out by using a technique ensuring a good surface condition (absence of crystalline microdefects and very low trap density), for example by reactive ionic etching. This quality of preparation of the surface of the groove is in fact required if it is desired to find again the very low surface recombination center density characteristics which led to the "planar" techniques being adopted for obtaining very high sensitivities.

With this planar-groove technique, low surface recombination rates may be maintained and consequently a high sensitivity of the pilot transistor. It avoids a short-circuit through the emitter junction of the pilot thyristor, which would hinder triggering thereof.

The gate 8 and emitter 7 preferably have a highly interdigitated structure, or any other equivalent structure, so that, as was explained above, the apparent shunt resistance with respect to the emitter-base junction of the main thyristor is, for a crystal of 1 cm square, a few hundred ohms for example, by using a layer resistance of layer P which will for example be of the order of 10 ohms per square (which is generally shown as 10 $\Omega/\square$). Such a structure will in general not be indispensable for the emitter junction of the auxiliary thyristor, because of its very small size.

Preferred processes will be given further on for forming the structure which has just been described, which processes allow more especially a very sensitive main thyristor to be obtained. The main structure is of the "mesa" type (i.e. isolated by lapping and etching at the periphery of the wafer, followed by passivation). When a supply voltage of 220 Veff for example is applied to the anode terminal A, with terminal K at zero volts (when $I_1$ and $I_2$ are open), the same goes for region 5 and the low current injected into gate Ga through the capacitor Cass is sufficient to cause the auxiliary thyristor to strike shortly after the first zero-crossing of the supply voltage, in accordance with the assisted self-firing operating principle described in the above-mentioned patent application. It will be noted that the emitter junction of the auxiliary thyristor is protected from the short-circuit by the resistance which exists between the corresponding inhibition base portions of the two thyristors.

At that time, with the common base P at a potential close to that of the anode and with the short-circuit between the gate Gp and emitter 4 removed since $I_1$ is still open, the main current of the auxiliary thyristor passes into the first emitter junction of the main thyristor, and this latter fires rapidly. Firing is propagated very rapidly to the whole of the surface of the emitter contact. This firing surface may occupy about 80% of the total surface of the wafer.

The amplifying gate structure according to this first embodiment of the invention is adapted for switching currents going for example from several tens to several hundred amps.

It will however be noted that the gain of the PNP transistor of such a structure is relatively low, for its N base must have a relatively large thickness so as to ensure voltage resistance. The result is that, such as described above, the structure will be no longer capable of self-firing for supply voltages of 380 Veff, for example, except if the NPN transistor is given a very high gain at very low level.

This is why, according to a second embodiment, illustrated in FIG. 2, the structure is formed with double layer emitters, advantageously in accordance with the following process, given by way of non limitative example:

(a) an N$^-$ silicon substrate 2 is required which is weakly doped (e.g. $10^{14}$ A/cm$^3$) for withstanding the high voltage, (b) a P+ diffusion is made over the rear face, so as to form the second emitter region 3, (c) a thick P type epitaxy is effected on the front face, with an impurity concentration of $10^{17}$ A/cm$^3$ for example, followed by exodiffusion for reducing the surface impurity concentration, in order to reduce the risk of migration of impurities into the N layer which will be formed in step (d). Thus, the first P base region of the structure is obtained, (d) over the whole surface of the wafer a thin (a few microns) N type epitaxy is effected with an impurity concentration of $10^{15}$ A/cm$^3$ for example, (e) over the face of the gate contacts a thin diffusion or ionic implantation of P+ type is effected, at reduced temperature, for receiving the gate contacts; this highly doped surface base layer allows a very reduced basic internal resistance to be obtained (a few tenth of ohms) which guarantees very good dV/dt behavior, (f) groove 7 is formed in the way mentioned above, (g) in the emitter 4 and 5 regions a very thin (one micron, for example) N+ type diffusion is effected locally (concentration: $10^{19}$ A/cm$^3$ for example), at reduced temperature or ionic implantation, (h) a silicon oxide deposit is formed.

The contacts are then formed in a conventional way.

The peripheral isolation of the two PN junctions is achieved in a conventional way and different known expedients are used for increasing the voltage resistance. However, a planar isolation may be effected, independently of the object of the patent.

All the critical surface operations (oxide growth or deposit, passivations, and others) are carried out with very great care as regards cleanliness as mentioned in the above French patent application No. 82 19728. With this double layer emitter technology, beta gains of the order of 1000 to 1 mA may be obtained because it reduces the recombination current of the minority carriers through the emitter-base space charge region.

As a variant, operation (b) may further comprise a P+ diffusion on the front face and step (c) will then be omitted.

In FIG. 3, a third embodiment of the structure has been illustrated consisting in forming ultra-thin doped emitters from deposited polycrystalline silicon. More delicate to use than the process of the second embodiment described above, this process on the other hand has the following advantages:

with it, a "planar" isolation may be obtained through self-alignment on the diffused zone with respect to the diffusion window, the lateral parasite base resistance may be reduced by means of a buried P+ layer, the risk of damage to the N emitter layer by back-diffusion of P type ions during formation of the P+ layer is reduced.

Although it provides a lower voltage resistance for the emitters, this resistance is sufficient for correct operation of the device and is therefore not disadvantageous in the application described here.

The process will be identical to the one which is described above in so far as the operations (a)-(b)-(c) are concerned.

Then the following operations are carried out:

(d) local implantation on the front face of buried P+ type bases, (e) a second thin epitaxy (for example 2 microns) of N type, with for example an impurity concentration of $10^5$ A/cm$^3$ effected over the whole front face, (f) a thin local P+ diffusion, carried out at the level of the local buried P+ implantations, or a second ionic implantation, this operation is for forming contact making regions Gp and Ga, (g) formation of the groove 7 in the manner already described, (h) thin reoxidization at reduced temperature, with photo-etching for baring the emitter regions, (i) deposition of an N+ doped polycrystalline silicon layer, then photo-etching for defining the emitter regions, (j) the very thin diffusion (one micron) of this N+ polycrystalline layer in the solid state, by heat treatment at reduced temperature (800° to 900° C.).

This diffusion provides the N layer of the double layer emitters.

The contacts are made and the peripheral isolation of the junctions is achieved as explained above and all the critical surface operations will also be carried out with the precautions mentioned.

It goes without saying that different other embodiments may be imagined without departing from the spirit of the invention. If it is desired to form a thyristor structure capable of dealing with even higher powers, the structure described in the present application may be used as the pilot of a larger sized thyristor structure whose self-firing it would trigger off.

We claim:

1. An integrated self-firing thyristor structure comprising
    (i) a main thyristor having
        a first emitter portion;
        a main base carried by said first emitter portion;
        a first inhibition base carried by said main base and traversed through by a small sized central bore having an inner surface;
        a second emitter portion carried by said first inhibition base and forming therewith a first base-emitter junction;
    (ii) an auxiliary thyristor using said first emitter portion and said main base and further comprising a second inhibition base carried by said main base, said second inhibition base extending into said bore and having a peripheral surface, a cenntral portion and a peripheral portion, and a third emitter portion carried by said central portion of the second inhibition base and forming therewith a second base-emitter junction;

(iii) a groove completely surrounding said second inhibition base and formed between said inner surface and said peripheral surface, said groove being adapted to have between said first inhibition base and said second inhibition base a resistance, the value of which is at least of the order of a megohm;

(iv) a first contact element electrically connected to said first emitter portion and constituting the anode of the integrated thyristor structure, a second contact element electrically connected to said second emitter portion and constituting the cathode of the integrated thyristor structure, a third contact element electrically connected to said third emitter portion, a fourth contact element electrically connected to the second inhibition base and a fifth contact element electrically connected to said first inhibition base;

(v) a conductive element connecting therebetween said third contact element and said fifth contact element;

(v) a first switching circuit connected between said conductive element and said fourth contact element and a second switching circuit connected between said conductive element and said second contact element.

2. The structure according to claim 1, in which said groove is covered by a layer thermally oxided according to the "planar groove technique".

3. The structure according to claim 1, in which said fifth contact element of the main thyristor is placed outside said second emitter portion of said main thyristor.

4. The structure according to claim 1, in which said main thyristor and said auxiliary thyristor is adapted so that the apparent shunt resistance with respect to the corresponding emitter-base junction is very small, advantageously of the order of a few hundredth to a few tenth of ohms.

5. The structure according to claim 1, which further comprises a firing assistance admittance connecting said first contact element which forms an anode common to the main and auxiliary thyristors, to the fourth contact element which constitutes the gate contact of the auxiliary thyristor.

6. The structure according to claim 1, in which the third emitter portion of the auxiliary thyristor is in the form of a double N+N− layer doped concentration structure.

7. The structure according to claim 1, in which the third emitter portion of the auxiliary thyristor comprises an N+ doped deposited polycrystalline silicon layer.

* * * * *

UNITED STATES PATENT AND TRADEMARK OFFICE
CERTIFICATE OF CORRECTION

PATENT NO. : 4,599,633
DATED : July 8, 1986
INVENTOR(S) : Jacques Thire et al.

It is certified that error appears in the above-identified patent and that said Letters Patent are hereby corrected as shown below:

Amend the Title to read:

"INTEGRATED SELF-FIRING AND AMPLIFYING GATE THYRISTOR STRUCTURE FOR ON/OFF SWITCHING OF HIGH CURRENTS AND CONTROL CIRCUIT THEREOF."

Signed and Sealed this

Seventeenth Day of March, 1987

*Attest:*

DONALD J. QUIGG

*Attesting Officer*  *Commissioner of Patents and Trademarks*